United States Patent
Liu et al.

(10) Patent No.: US 7,608,504 B2
(45) Date of Patent: Oct. 27, 2009

(54) MEMORY AND MANUFACTURING METHOD THEREOF

(75) Inventors: Chien-Hung Liu, Taipei (TW); Shou-Wei Huang, Hsinchu County (TW); Ying-Tso Chen, Kaoshsiung County (TW); Yu-Tsung Lin, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 211 days.

(21) Appl. No.: 11/468,311

(22) Filed: Aug. 30, 2006

(65) Prior Publication Data

US 2008/0054322 A1 Mar. 6, 2008

(51) Int. Cl.
*H01L 21/00* (2006.01)
(52) U.S. Cl. ........................ 438/257; 438/276; 438/735
(58) Field of Classification Search ................. 438/257, 438/276, 735
See application file for complete search history.

(56) References Cited

U.S. PATENT DOCUMENTS

| | | | | |
|---|---|---|---|---|
| 5,406,103 A * | 4/1995 | Ogawa | ........................ | 257/306 |
| 5,792,690 A * | 8/1998 | Sung | .......................... | 438/253 |
| 5,966,603 A | 10/1999 | Eitan | | |
| 6,239,500 B1 * | 5/2001 | Sugimachi | .................. | 257/203 |
| 6,440,797 B1 | 8/2002 | Wu et al. | | |
| 6,440,803 B1 * | 8/2002 | Huang et al. | ................. | 438/276 |
| 6,686,242 B2 * | 2/2004 | Willer et al. | ................. | 438/257 |
| 6,713,315 B2 * | 3/2004 | Kuo et al. | ...................... | 438/72 |
| 6,784,483 B2 * | 8/2004 | Chen | .......................... | 257/317 |
| 6,873,007 B2 * | 3/2005 | Sugita et al. | ................. | 257/321 |
| 6,927,448 B2 * | 8/2005 | Liu | ............................. | 257/315 |
| 7,016,225 B2 * | 3/2006 | Roizin et al. | ........... | 365/185.03 |
| 7,179,710 B2 * | 2/2007 | Liu | ............................. | 438/257 |
| 7,202,540 B2 * | 4/2007 | Komori et al. | .............. | 257/408 |
| 7,253,046 B2 * | 8/2007 | Higashi et al. | .............. | 438/216 |
| 7,410,857 B2 * | 8/2008 | Higashi et al. | .............. | 438/216 |
| 2003/0040152 A1 | 2/2003 | Liu et al. | | |
| 2003/0178687 A1* | 9/2003 | Kuo et al. | .................... | 257/390 |
| 2004/0043622 A1* | 3/2004 | Chen | .......................... | 438/735 |
| 2004/0100822 A1* | 5/2004 | Roizin et al. | ........... | 365/185.03 |
| 2005/0006694 A1* | 1/2005 | Liu | ............................. | 257/315 |
| 2005/0073002 A1 | 4/2005 | Tokumitsu | | |
| 2005/0199913 A1* | 9/2005 | Hofmann et al. | ............ | 257/204 |
| 2006/0001078 A1* | 1/2006 | Liu | ............................. | 257/315 |
| 2007/0117322 A1* | 5/2007 | Liu | ............................. | 438/257 |
| 2008/0054322 A1* | 3/2008 | Liu et al. | .................... | 257/296 |

* cited by examiner

*Primary Examiner*—Laura M Menz
(74) *Attorney, Agent, or Firm*—Thomas, Kayden, Horstemeyer & Risley (57) ABSTRACT

A memory is provided. The memory includes a substrate, a number of parallel bit lines, a number of parallel word lines and at least a oxide-nitride-oxide (ONO) structure. The bit lines are disposed in the substrate. The word lines are disposed on the substrate. The word lines are crossed with but not perpendicular to the bit lines. The ONO structure is disposed between the word lines and the substrate.

5 Claims, 7 Drawing Sheets

MEMORY AND MANUFACTURING METHOD THEREOF

This application incorporates by reference Taiwanese application Serial No. 95131805, filed Aug. 29, 2006.

BACKGROUND OF THE INVENTION

1. Field of the Invention

The invention relates in general to a memory and a manufacturing method thereof, and more particularly to a memory having a number of bit lines and a number of word lines crossed with but not perpendicular to the bit lines and a manufacturing method thereof.

2. Description of the Related Art

Figure 1A:
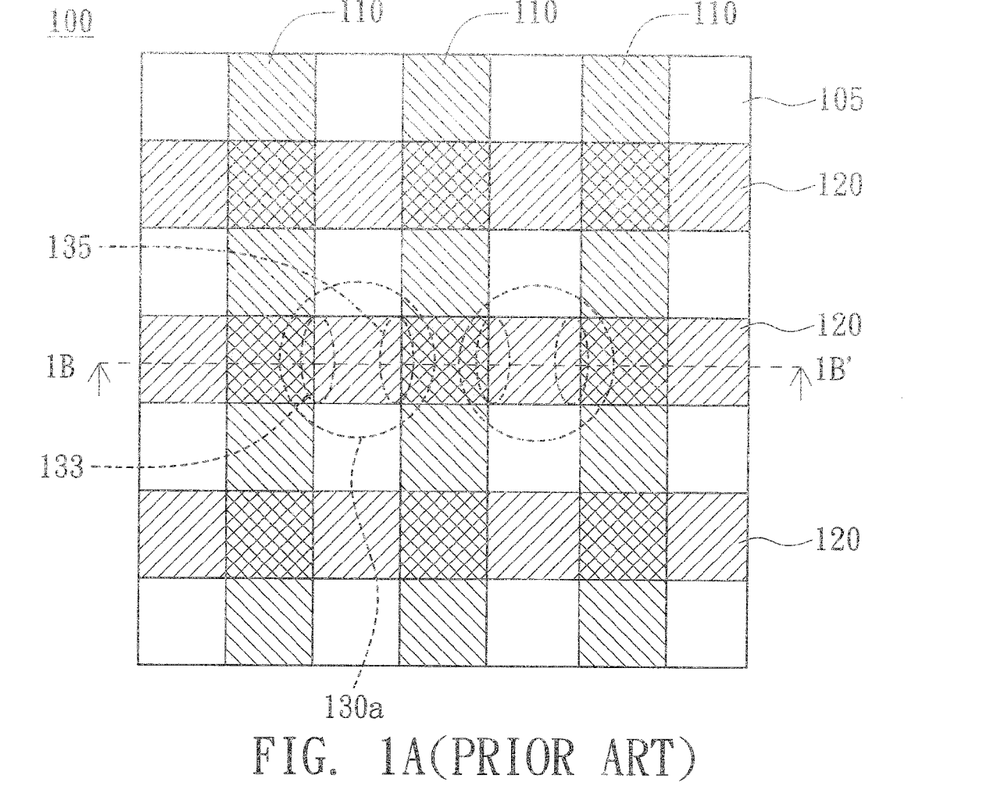
FIG. 1A (prior art) is a partial top view of a conventional dual bit nitride read only memory.
Figure 1B:
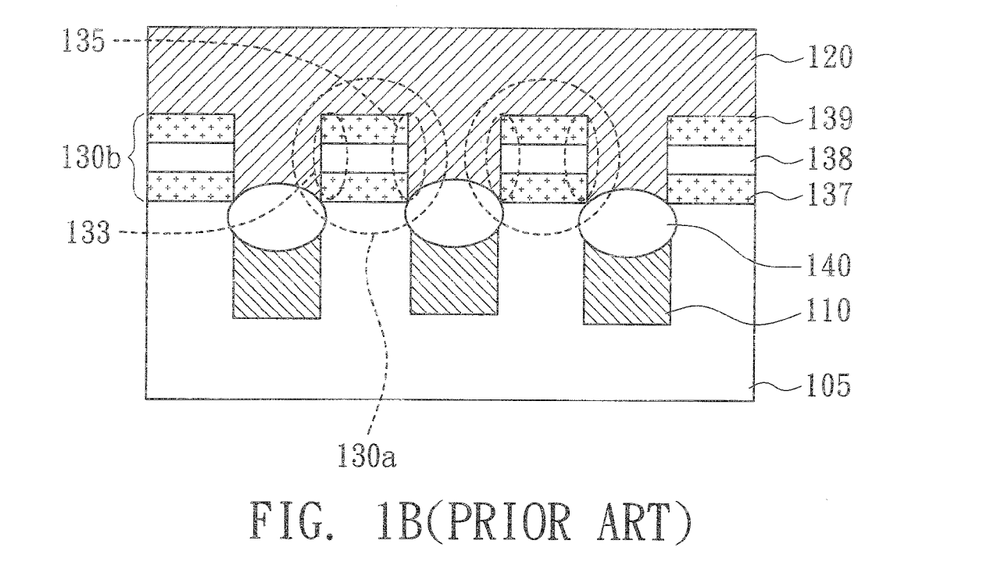
FIG. 1B (prior art) is a cross-sectional view of the dual bit nitride read only memory along the cross-sectional line 1B~1B' of FIG. 1A.

Referring to FIGS. 1A~1B. FIG. 1A is a partial top view of a conventional dual bit nitride read only memory. FIG. 1B is a cross-sectional view of a dual bit nitride read only memory (NROM) along the cross-sectional line 1B~1B' of FIG. 1A. In FIGS. 1A~1B, the NROM 100 includes a silicon substrate 105, a number of embedded bit lines 110, a number of word lines 120, a number of oxide-nitride-oxide (ONO) structures 130b, a number of barrier diffusion oxide layers 140, a number of memory cells 130a (enclosed in larger dotted circles in FIG. 1A and FIG. 1B), a number of first bit storage nodes 133 and a number of second bit storage nodes 135 (enclosed in smaller dotted circles in FIG. 1A and FIG. 1B).

The embedded bit lines 110 are disposed in parallel and formed in the silicon substrate 105. The word lines 120 are disposed in parallel and formed on the silicon substrate 105. The work line 120 are vertically criss-crossed with the embedded bit line 110. The ONO structures 130b are disposed between each word line 120 and the silicon substrate 105. Each ONO structure 130b includes a bottom oxide layer 137, a silicon nitride (SiN) layer 138 and a top oxide layer 139 in a bottom-up order. Besides, the barrier diffusion oxide layers 140 are formed on the embedded bit lines 110 for isolating the word lines 120 and the bit lines. The first bit storage node 133 and the second bit storage node 135 are correspondingly formed in each ONO structure 130b adjacent to the two barrier diffusion oxide layers 140.

Since the NROM 100 are normally exposed to background radiation, the electron concentration in the first bit storage node 133 and the second bit storage node 135 of the memory cell 130a tends to decrease. Consequently, errors may occur to the bits stored in the memory cell, affecting the correctness of the overall data when reading.

SUMMARY OF THE INVENTION

It is therefore an object of the invention to provide a memory and a manufacturing method thereof. The design of having the bit lines be crossed with but not perpendicular to the word lines enables the memory cell to have a larger electron storage space, hence having a higher concentration of electron storage. When the background radiation causes loss to the electrons stored in the memory cell, the decrease in the electron concentration of the memory cell having a high concentration of electron storage is still within a tolerable range. Therefore, the bits stored in the memory cell are still correct and the overall data are free of errors when reading.

The invention achieves the above-identified object by providing a memory. The memory includes a substrate, a number of parallel bit lines, a number of parallel word lines and at least a oxide-nitride-oxide (ONO) structure. The bit lines are disposed in the substrate. The word lines are disposed on the substrate. The word lines are crossed with but not perpendicular to the bit lines. The ONO structure is disposed between the word lines and the substrate.

The invention further achieves the above-identified object by providing a method of manufacturing a memory. Firstly, a substrate is provided. Next, at least a oxide-nitride-oxide (ONO) structure is formed on the substrate. Then, a number of parallel bit lines are formed in the substrate. Afterward, a number of parallel word lines are formed on the substrate. The word lines are crossed with but not perpendicular to the bit lines.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 2A:
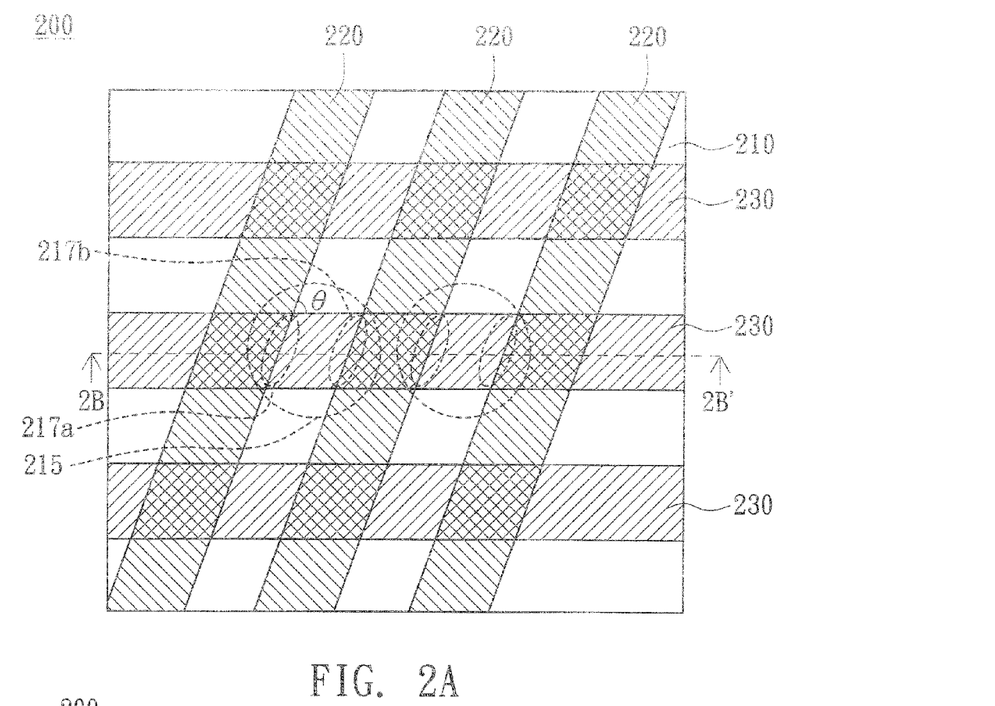
FIG. 2A is partial top view of a memory according to a first embodiment of the invention.
Figure 2B:
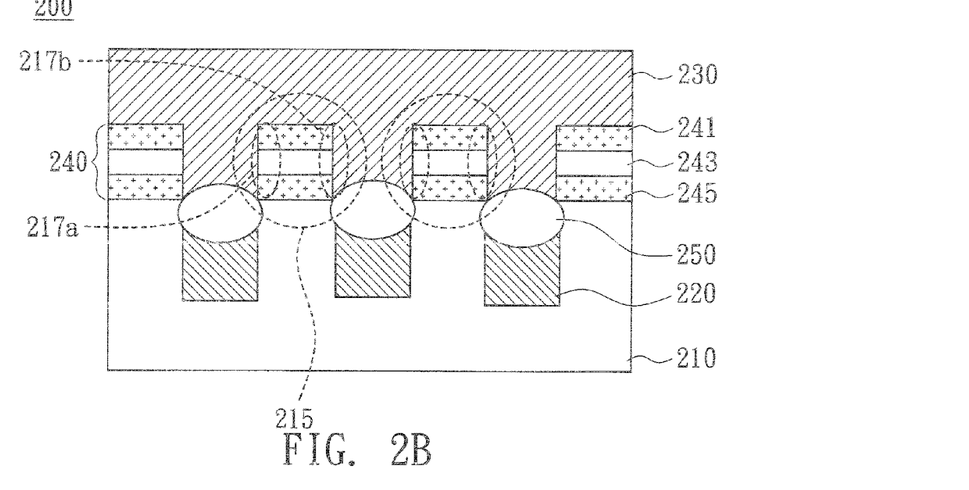
FIG. 2B is a cross-sectional view of the memory along the cross-sectional line 2B~2B' of FIG. 2A.

Referring to FIGS. 2A~2B. FIG. 2A is a partial top view of a memory according to a first embodiment of the invention. FIG. 2B is a cross-sectional view of the memory along the cross-sectional line 2B~2B' of FIG. 2A. In FIGS. 2A~2B, the memory 200 includes a substrate 210, a number of bit lines 220, a number of word lines 230, a number of oxide-nitride-oxide (ONO) structures 240, a number of isolation layers 250, a number of memory cells 215 (enclosed in larger dotted circles in FIG. 2A and FIG. 2B), a number of first bit storage nodes 217a, and a number of second bit storage nodes 217b. The bit lines 220 are disposed in parallel, formed in the substrate 210, and positioned near the surface of the substrate 210. The word lines 230 are disposed in parallel and formed on the substrate 210. Furthermore, the word lines 230 are crossed with but not perpendicular to the bit lines 220. That is, an acute angle θ is contained between the word lines 230 and the bit lines 220. In the present embodiment of the invention, the acute angle θ is contained between the word line 230 and bit line 220 is preferably 45 degrees. The ONO structures 240 are disposed between the word lines 230 and the substrate 210, and spaced by the bit lines 220. The isolation layers 250 are disposed on the bit lines 220 and spaced by the ONO structures for isolating the word lines 230 and the bit lines 220. The first bit storage node 217a and the second bit storage node 217b are correspondingly formed in each ONO structure 240 adjacent to the two isolation layers 250. In the present embodiment of the invention, the substrate 210 is exemplified by a silicon substrate. The memory 200 is a dual bit nitride read only memory (NROM).

Referring to FIG. 2B. The ONO structure 240 includes a top oxide layer 241, a bottom oxide layer 245, and a nitride layer 243. The bottom oxide layer 245 is disposed on the substrate. The top oxide layer 241 is disposed on the bottom oxide layer 245. The nitride layer 243 is disposed between the top oxide layer 241 and the bottom oxide layer 245. The material of the nitride layer 243 includes silicon nitride (SiN), and the material of the word line 230 includes polysilicon. The isolation layer is a barrier diffusion (BD) oxide. However, any one who is skilled in the technology of the invention will understand that the material is exemplified as an example in the present embodiment of the invention not for limiting the scope of technology of the invention.

The memory cells 215 include the word lines 230, the bit lines 220 and the ONO structures 240. The memory cells 215 are arranged as a memory cell array as shown in FIG. 2A. Each memory cell 215 has a first bit storage node 217a and a second bit storage node 217b. The first bit storage node 217a and the second bit storage node 217b in each memory cell 215 are alternated and disposed along the direction of the word line 230.

Referring to FIGS. 3A~3E, cross-sectional diagrams showing the manufacturing process of the memory according to the first embodiment of the invention are shown. Firstly, in FIG. 3A, a substrate 210 is provided, and then a oxide-nitride-oxide (ONO) layer 235 is formed into a piece on the substrate 210. In the step of forming the ONO structure 235, firstly, the bottom oxide layer 245a is formed into a piece on the substrate 210. Then, the nitride layer 243a is formed into a piece on the bottom oxide layer 245a. Finally, the top oxide layer 241a is formed into a piece on the nitride layer 243a.

Figure 3A:
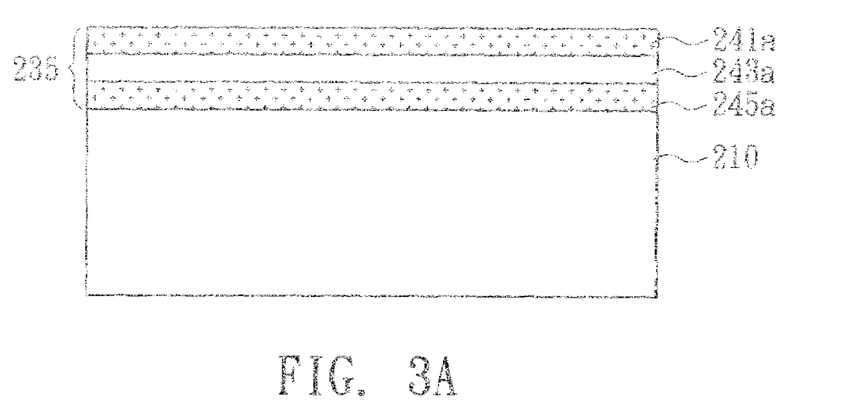
FIGS. 3A~3E are cross-sectional diagrams showing the manufacturing process of the memory according to the first embodiment of the invention.
Figure 3B:
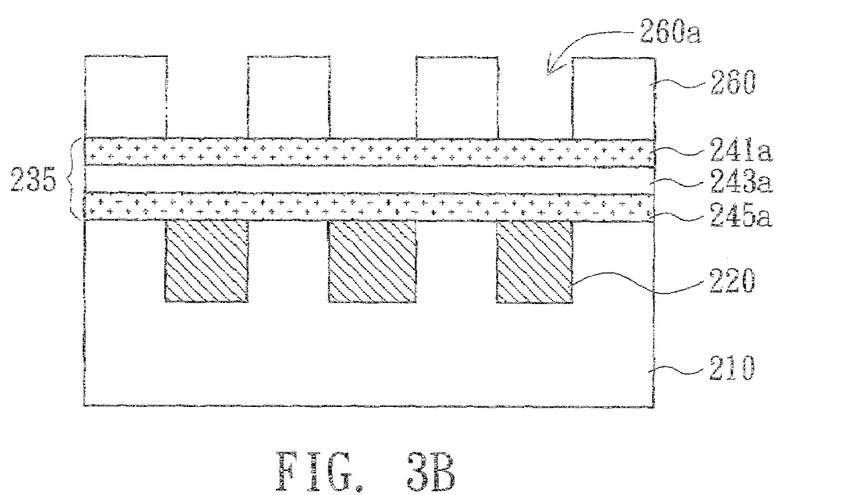

Next, in FIG. 3B, a patterned photo-resist layer 260 is formed on the ONO structure 235. The patterned photo-resist layer 260 has a number openings 260a for exposing part of the ONO structure 235. Then, a number of parallel bit lines 220 are formed in the part of the substrate 210 corresponding to the openings 260a by using ion implantation process.

Figure 3C:
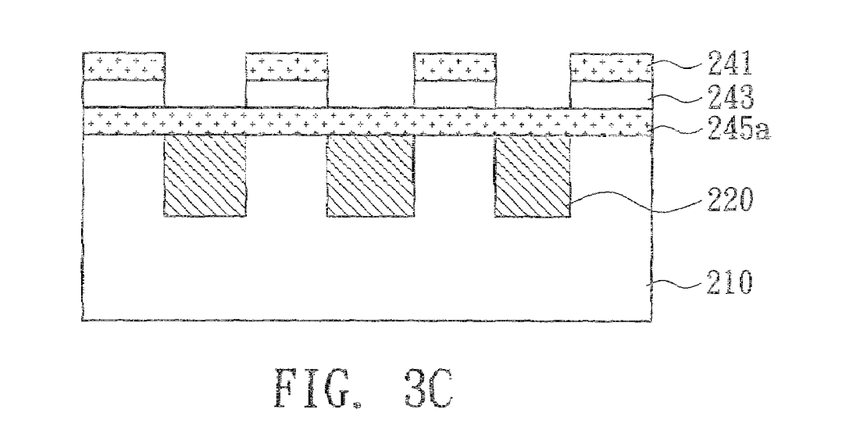

Then, in FIG. 3C, firstly, part of the top oxide layer 241a is removed. Then, part of the nitride layer 243a under there is removed. Finally, the patterned photo-resist layer 260 is removed.

Figure 3D:
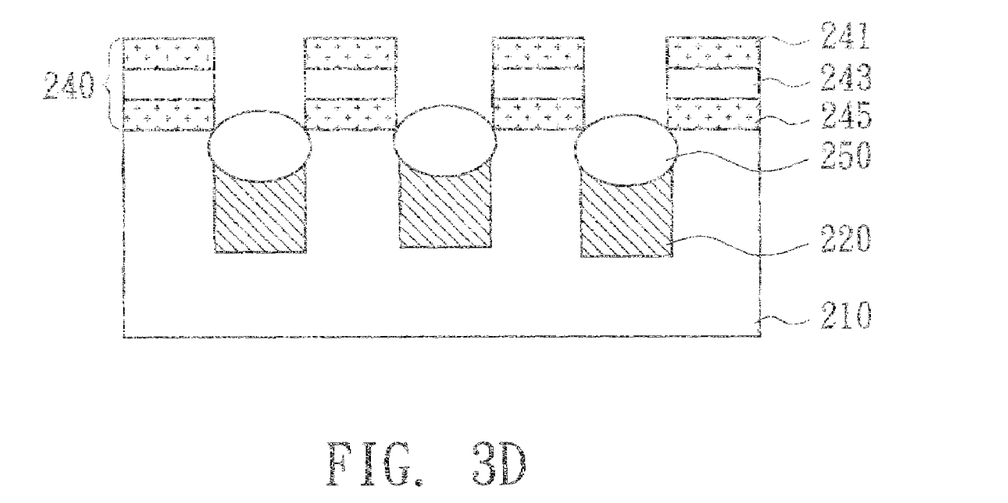

Next, in FIG. 3D, a number of isolation layers 250 are formed on the bit lines 220 and then a number of ONO structures 240 are formed on the substrate 210. The ONO structures 240 are spaced by the isolation layers 250.

Figure 3E:
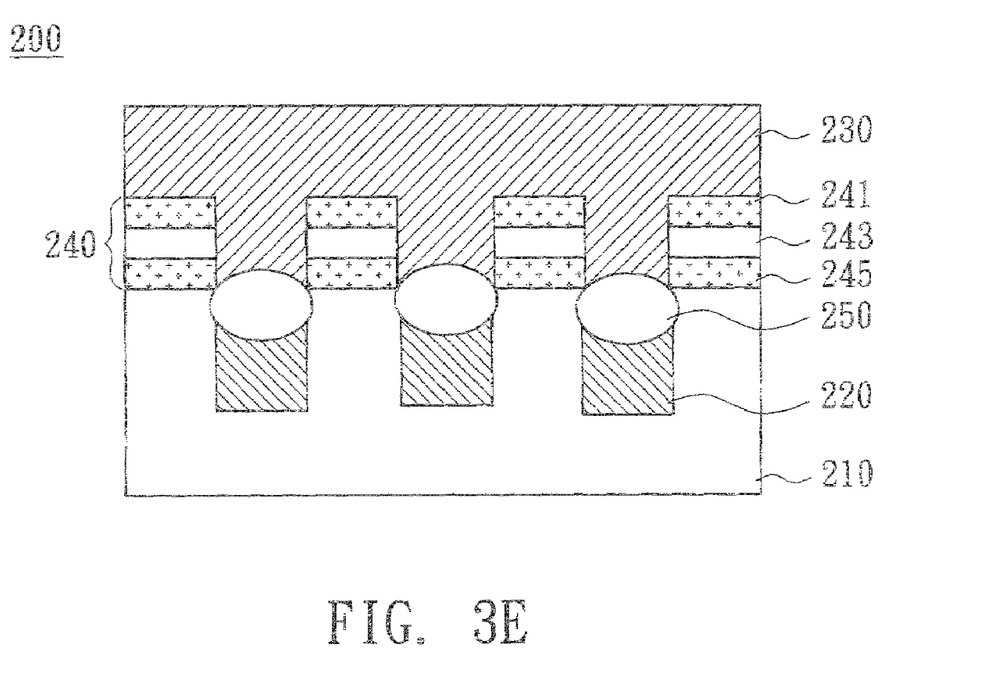

Then, in FIG. 3E, a number of parallel word lines 230 are formed on the substrate 210. The word lines 230 are crossed with but not perpendicular to the bit lines 220. An acute angle θ is contained between the word line 230 and the bit line 220. Furthermore, in the step of word lines 230, firstly, a polysilicon layer, is formed on the substrate 210, and then part of the polysilicon layer is removed by etching method to form the word lines 230. In the present embodiment of the invention, the acute angle θ contained between the word line 230 and the bit line 220 is preferably 45 degrees as shown in FIG. 2A. Thus, the dual bit nitride read only memory 200 is formed as shown in FIG. 3E.

In the present embodiment of the invention, the design of having the bit lines 220 be crossed with but not perpendicular to the word lines 230 enables the first bit storage node 217a and the second bit storage node 217b of the memory cell 215 to have a larger storage space and the concentration of electrons stored in the first bit storage node 217a and the second bit storage node 217b also increase. When the background radiation causes loss to the electrons stored in the memory cell, the decrease in the electron concentration of the memory cell having a high concentration of electron storage is still within a tolerable range. Therefore, the bits stored in the memory cell are still correct and the overall data are free of errors when reading.

Second Embodiment

Figure 4A:
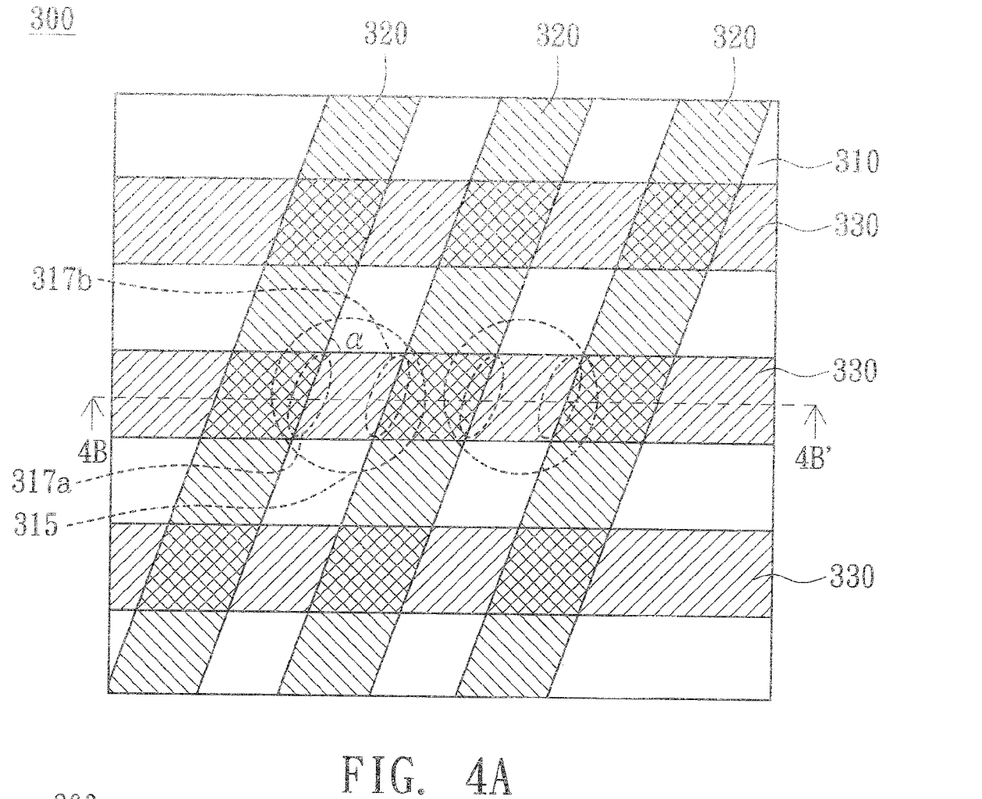
FIG. 4A is partial top view of a memory according to a second embodiment of the invention.
Figure 4B:
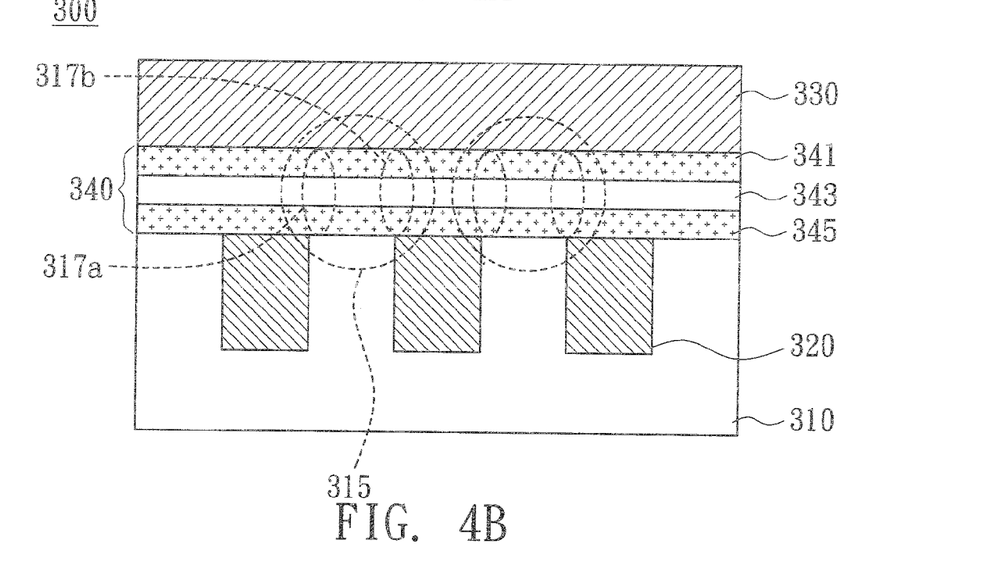
FIG. 4B is a cross-sectional view of the memory along the cross-sectional line 4B~4B' of FIG. 4A.

Referring to FIGS. 4A~4B. FIG. 4A is partial top view of a memory according to a second embodiment of the invention. FIG. 4B is a cross-sectional view of the memory along the cross-sectional line 4B~4B' of FIG. 4A. In FIGS. 4A~4B, the memory 300 includes a substrate 310, a number of bit lines 320, a number of word lines 330, a oxide-nitride-oxide (ONO) layer 340, a number of memory cells 315 (enclosed in larger dotted circles in FIG. 4A and FIG. 4B), a number of first bit storage nodes 317a, and a number of second bit storage nodes 317b. The bit lines 320 are disposed in parallel formed in the substrate 310, and positioned near the surface of the substrate 310. The word lines 330 are disposed in parallel and formed on the substrate 310. Furthermore, the word lines 330 are crossed with but not perpendicular to the bit lines 320. That is, an acute angle α is contained between the word lines 330 and the bit lines 320. In the present embodiment of the invention, the acute angle α is contained between the word line 330 and bit line 320 is preferably 45 degrees. The ONO structure 340 is continuously disposed into a piece on the substrate 310, and covers the bit lines 320. The word lines 320 are disposed on part of the ONO structure 340. The first bit storage node 317a and the second bit storage node 317b are correspondingly formed in part of ONO structure 340 adjacent to the sides of two isolation layers 250. In the present embodiment of the invention, the substrate 310 is exemplified by a silicon substrate. The memory 300 is a dual bit nitride read only memory (NROM).

Referring to FIG. 4B. The ONO structure 340 includes a top oxide layers 341, a bottom oxide layer 345, and a nitride layer 343. The bottom oxide layer 345 is disposed on the substrate. The top oxide layer 341 is disposed on the bottom oxide layer 345. The nitride layer 343 is disposed between the top oxide layer 341 and the bottom oxide layer 345. The material of the nitride layer 343 includes silicon nitride (SiN), and the material of the word line 330 includes polysilicon. The isolation layer is a barrier diffusion (BD) oxide. However, any one who is skilled in the technology of the invention will understand that the material is exemplified as an example in the present embodiment of the invention not for limiting the scope of technology of the invention.

The memory cells 315 include the word lines 330, the bit lines 320 and the ONO structure 340. The memory cells 315 are arranged as a memory cell array as shown in FIG. 4A. Each memory cell 315 has a first bit storage node 317a and a second bit storage node 317b. The first bit storage node 317a and the second bit storage node 317b in each memory cell 315 are alternated and disposed along the direction of the word line 330.

Referring to FIGS. 5A~5D, cross-sectional diagrams showing the manufacturing process of the memory according to the second embodiment of the invention are shown. Firstly, in FIG. 5A, a substrate 310 is provided, and then a oxidenitride-oxide (ONO) layer 340 is formed into a piece on the substrate 310. In the step of forming the ONO structure 340, firstly, the bottom oxide layer 345 is formed into a piece on the substrate 310. Then, the nitride layer 343 is formed into a piece on the bottom oxide layer 345. Finally, the top oxide layer 341 is formed into a piece on the nitride layer 343.

Figure 5A:
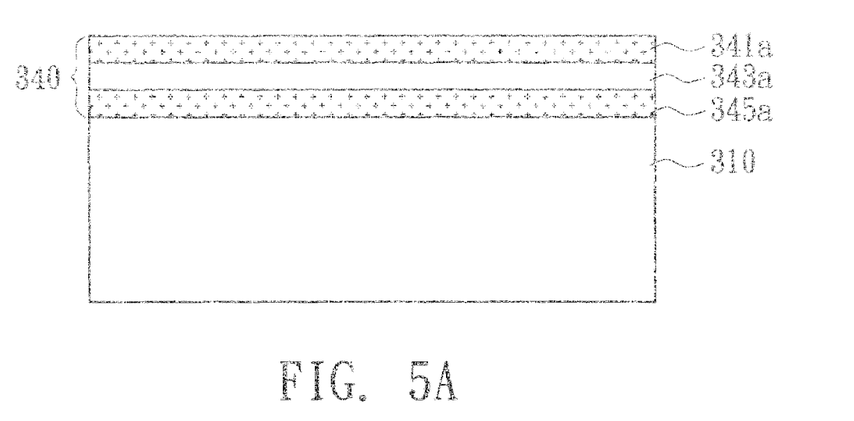
FIGS. 5A~5D are cross-sectional diagrams showing the manufacturing process of the memory according to the second embodiment of the invention.
Figure 5B:
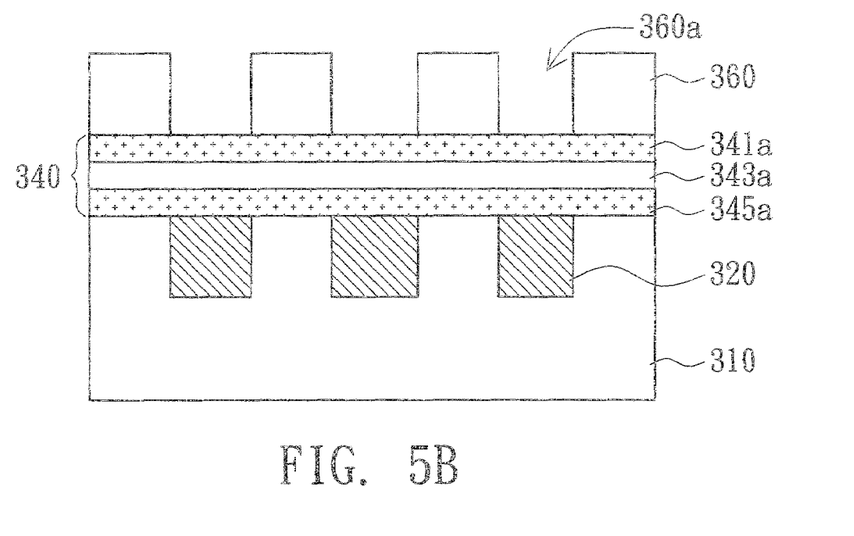

Next, in FIG. 5B, a patterned photo-resist layer 360 is formed on the ONO structure 340. The patterned photo-resist layer 360 has a number openings 360a for exposing part of the ONO structure 340. Then, a number of parallel bit lines 320 are formed in the part of the substrate 310 corresponding to the openings 360a by using ion implantation process.

Figure 5C:
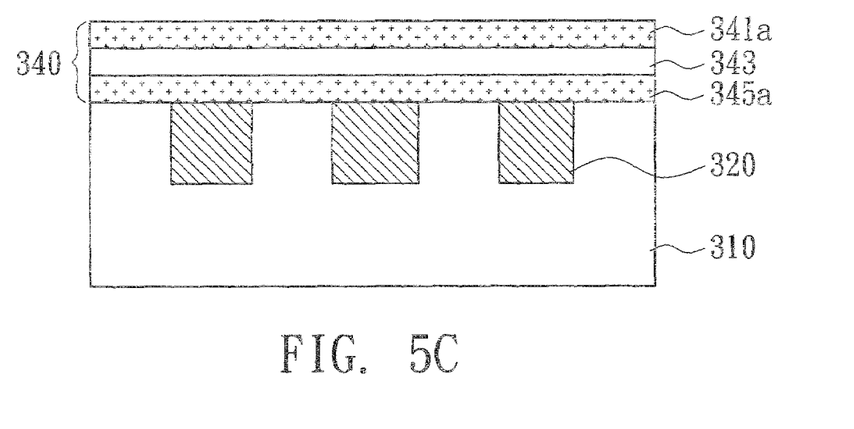

Then, in FIG. 5C, the patterned photo-resist layer 360 is removed.

Figure 5D:
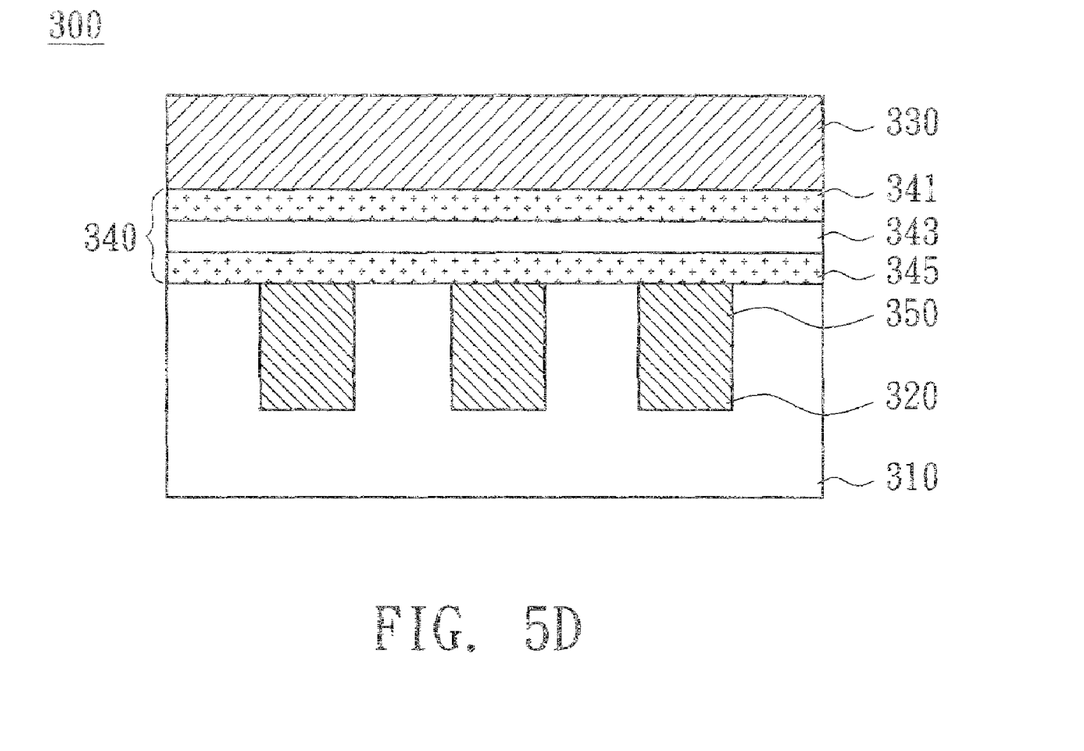

Next, in FIG. 5D, a number of parallel word lines 330 are formed on the part of the ONO structure 340. The word lines 330 are crossed with but not perpendicular to the bit lines 320. An acute angle α is contained between the word line 330 and the bit line 320. Furthermore, in the step of word lines 330, firstly, a polysilicon layer is formed on the ONO structure 340, and then part of the polysilicon layer is removed by etching method to form the word lines 330. In the present embodiment of the invention, the acute angle α contained between the word line 330 and the bit line 320 is preferably 45 degrees as shown in FIG. 4A. Thus, the dual bit nitride read only memory 300 is formed as shown in FIG. 5D.

According to the memory and the manufacturing method thereof disclosed in the above embodiment of the invention, the design of having the bit lines be crossed with but not perpendicular to the word lines enables the first bit storage node and the second bit storage node stored in the memory cell to have a larger storage space, hence the concentration of storage electron increases. When the background radiation causes loss to the electrons stored in the memory cell, the decrease in the electron concentration of the memory cell having a high concentration of electron storage is still within a tolerable range. Therefore, the bits stored in the memory cell are still correct and the overall data are free of errors when reading.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing a memory, comprising:
providing a substrate;
forming a first oxide-nitride-oxide (ONO) structure on the substrate, comprising:
   forming a bottom oxide layer on the substrate;
   forming a nitride layer on the bottom oxide layer; and
   forming a top oxide layer on the nitride layer;
forming a plurality of bit lines in the substrate, and all of the bit lines disposed in parallel, and step of forming the bit lines further comprising:
   forming a patterned photo-resist layer on the first ONO structure, wherein the patterned photo-resist layer has a plurality of openings for exposing part of the first ONO structure; and
   forming the bit lines in the part of the substrate corresponding to the openings; and
forming a plurality of word lines on the substrate, wherein the word lines are crossed with but not perpendicular to the bit lines.

2. The method according to claim 1, wherein the step of forming the bit lines in the part of the substrate corresponding to the openings further comprises:
   forming the bit lines in the part of the substrate corresponding to the openings by using ion implantation process.

3. The method according to claim 1, wherein between the step of forming the bit lines and the step of forming the word line further comprises:
   removing part of the top oxide layer;
   removing part of the nitride layer;
   removing the patterned photo-resist layer;
   forming a plurality of isolation layers on the bit lines; and
   forming a plurality of second ONO structures on the substrate, wherein the second ONO structures are spaced by the isolation layers.

4. The method according to claim 3, wherein the step of forming the word lines further comprises:
   forming the word lines on the substrate, wherein the word lines cover the second ONO structures and the isolation layers, and the word lines are crossed with the bit lines at 45 degrees.

5. The method according to claim 1, wherein the step of forming the word lines further comprises:
   forming the word lines on part of the first ONO structure, wherein the word lines are crossed with the bit lines at 45 degrees.

* * * * *

UNITED STATES PATENT AND TRADEMARK OFFICE
CERTIFICATE OF CORRECTION

PATENT NO.      : 7,608,504 B2                                  Page 1 of 1
APPLICATION NO. : 11/468311
DATED           : October 27, 2009
INVENTOR(S)     : Liu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 269 days.

Signed and Sealed this

Twelfth Day of October, 2010

David J. Kappos
*Director of the United States Patent and Trademark Office*